United States Patent
Matsuhira

[11] Patent Number: 5,860,212
[45] Date of Patent: Jan. 19, 1999

[54] METHOD OF COATING A CONDUCTIVE SUBSTANCE ON A TRANSPARENT ELECTRODE FORMED ON A SUBSTRATE AND METHOD OF MOUNTING A SEMICONDUCTOR DEVICE OR FILM SUBSTRATE ON THE SUBSTRATE

[75] Inventor: Tsutomu Matsuhira, Chiba, Japan

[73] Assignee: Seiko Instruments Inc., Japan

[21] Appl. No.: 408,319

[22] Filed: Mar. 22, 1995

[30] Foreign Application Priority Data

Mar. 30, 1994 [JP] Japan ..................... 6-085988
Feb. 13, 1995 [JP] Japan ..................... 7-047743

[51] Int. Cl.⁶ ........................................ H05K 3/34
[52] U.S. Cl. ........................ 29/840; 349/133; 349/155
[58] Field of Search .................... 437/181, 180; 349/155, 133; 29/840

[56] References Cited

U.S. PATENT DOCUMENTS

| | | |
|---|---|---|
| 3,936,930 | 2/1976 | Stern ..................... 349/155 X |
| 5,042,919 | 8/1991 | Yabu et al. . |
| 5,179,460 | 1/1993 | Hinata et al. . |
| 5,223,965 | 6/1993 | Ota et al. . |
| 5,317,438 | 5/1994 | Suzuki et al. . |
| 5,327,272 | 7/1994 | Fujiwara et al. ............. 349/133 X |
| 5,342,477 | 8/1994 | Cathey ..................... 437/181 X |
| 5,406,397 | 4/1995 | Kodera et al. . |
| 5,438,443 | 8/1995 | Tanguchi et al. ............. 349/155 |
| 5,497,257 | 3/1996 | Hotta et al. ................. 349/155 |
| 5,517,343 | 5/1996 | Yamahara et al. ............ 437/180 X |
| 5,671,029 | 9/1997 | Haruki . |
| 5,689,352 | 11/1997 | Kishigami . |

FOREIGN PATENT DOCUMENTS 2-195324  8/1990  Japan ..................... 349/126

*Primary Examiner*—Carl J. Arbes
*Attorney, Agent, or Firm*—Adams & Wilks

[57] ABSTRACT

A method of coating a conductive substance on a transparent electrode disposed on a substrate comprises disposing a resin containing the conductive substance over the surface of the substrate, and rubbing and pressing the resin over the surface of the substrate with a pressing shaft to coat a layer of the resin on the transparent electrode. A method of mounting a semiconductor device or the film substrate on the substrate having the transparent electrode coated with the resin layer containing the conductive substance comprises connecting a terminal portion of the semiconductor device or film substrate to the transparent electrode through the resin layer.

30 Claims, 7 Drawing Sheets

F I G. 4
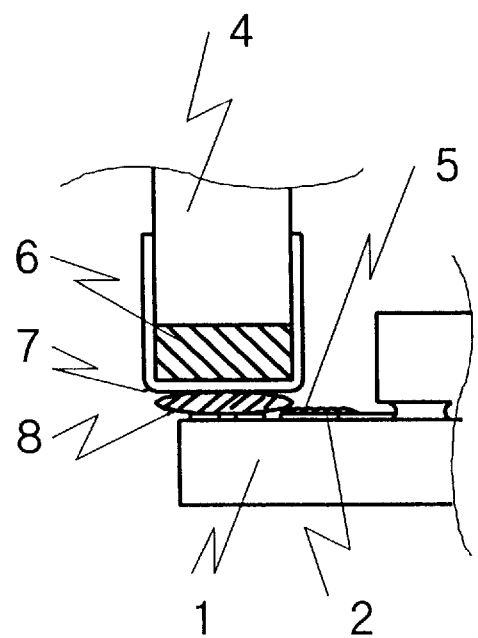

METHOD OF COATING A CONDUCTIVE SUBSTANCE ON A TRANSPARENT ELECTRODE FORMED ON A SUBSTRATE AND METHOD OF MOUNTING A SEMICONDUCTOR DEVICE OR FILM SUBSTRATE ON THE SUBSTRATE

BACKGROUND OF THE INVENTION

The present invention relates to an electrode substrate used in an electronic device such as a liquid crystal electro-optical device, a method for coating transparent electrodes on such an electrode substrate with a conductive substance, and a mounting method of an IC chip and a film substrate.

Conventionally, since an ITO pattern for external connection that was formed on a glass substrate of a liquid crystal electro-optical device had a high resistance, it was designed to be wide, for instance. When necessary, electroless nickel plating etc. was performed to reduce the electrode resistance. In a method of printing a conductive paste, the conductor width could not be reduced to less than about 100 μm, which, for instance, causes limitations on the pattern shape. This method could not be applied to, for instance, a part of a product having a complex shape. Further, there was a limitation in terms of a manufacturing process, such as a requirement that printing should be performed on a substrate that was in a board-like form.

Conventionally, face-down mounting of an IC chip was performed in the following manner in the case of a liquid crystal electro-optical device, for instance. Solder bumps were formed on an IC chip. A substrate-side pattern of a liquid crystal panel is formed by subjecting an ITO pattern to nickel electroless plating. After the pads of the IC chip and the substrate-side pads of the liquid crystal panel are positioned with respect to each other, soldering is effected by heat-melting the solder bumps of the IC chip with infrared light, etc. Alternatively, as shown in FIG. 13, an anisotropic conductive film 18 of a thermosetting adhesive or a thermosetting and thermoplastic adhesive containing connecting particles that have been produced by subjecting plastic particles to nickel and gold plating and then applying an insulating film thereto are temporarily attached to a substrate. After an IC chip 10 having gold bumps 11 is positioned with respect to ITO electrodes 2 of the substrate, the anisotropic conductive film of the adhesive is set by thermo-compression bonding, and the gold bumps of the IC chip and the ITO electrode of the substrate are connected to each other by breaking the insulating films by applying pressure to and heating the conducting particles interposed therebetween. As a further alternative, gold bumps of about 60 μm in height are formed on an IC chip and an Ag paste is contact-transferred to only the bump portions. After the bumps are positioned with respect to ITO electrodes, connection is made by setting the Ag paste adhesive by heating.

In the case of film substrates such as a TCP and FPC, terminals of a liquid crystal panel and terminals of a film substrate were connected to each other by heating and pressure application using an anisotropic conductive film equivalent to the above-described one or produced by plating plastic particles only with nickel and gold.

In the conventional techniques, in the case of a liquid crystal electro-optical device, the resistance of transparent electrodes cannot be reduced to less than 10 Ω/□ in the mass-production level. The line width should be properly adapted, because display nonuniformity occurs due to a difference in line resistance if connecting lengths from external connection electrodes to pixel portions of a display screen are not uniform. In the case of simple matrix driving with a duty of 1/240, a difference in line resistance of 500 Ω to 1 kΩ causes display nonuniformity. Therefore, it is difficult to attain high-density pattern layout. In the case of COG mounting of two or more chips, display nonuniformity or display defects may occur due to a high ITO resistance when a bus line is formed by utilizing panel electrodes. To solve this problem, auxiliary electrodes need to be formed by electroless plating, which will increase the cost. If the ITO electrodes are designed to be wide, the external size becomes large and the number of liquid crystal panels taken is reduced, resulting in a cost increase.

In the COG mounting of a liquid crystal electro-optical device, the solder bump connection causes a cost increase, because ITO is subjected to nickel electroless plating. Since the pitch cannot be reduced to less than 200 μm, it is not suitable for high-density connection. In the case of the connection method using the anisotropic conductive film, a size variation of connecting particles need to be made about 5 μm because bumps of an IC have a height variation of about 1 μm, and the connecting particles need to be contained in an adhesive by more than 70 wt%. Thus, the cost becomes high. In conjunction with the above, since connection weighing of more than 50 g/bump is required, weight is applied to the IC in an unbalanced manner, reducing the yield. Further, since the anisotropic conductive film is temporarily attached to the substrate side in advance, it is difficult to perform pattern recognition in positioning the pads of the IC chip with respect to the ITO pattern, resulting in reduced productivity. Further, in the Ag paste method, the Ag transfer cannot be performed properly if the bump height of the IC chip is smaller than 30 μm. Therefore, the bumps should be as high as 30–60 μm, which causes a cost increase. Further, it is difficult to perform connection of a pitch less than 150 μm, which causes limitations on the pattern layout of an IC chip. Since it is difficult to reduce the size of an IC chip, the cost is not decreased.

In a liquid crystal electro-optical device, since terminals of a glass substrate are connected to a film substrate by thermo-compression bonding, a positional deviation occurs between the terminals due to expansion of the film. Further, since the heating step requires the film to have heat resistance, stability of dimensions, etc., a polyimide film is generally used, which makes it difficult to attain a decrease in cost.

DESCRIPTION OF THE INVENTION

To solve the above problems, in a substrate on the surface of which a transparent conductive film was formed, a resin containing a conductive substance was formed on the transparent conductive film by rubbing the resin against the substrate. Further, the thickness of the resin containing the conductive substrate formed on the transparent conductive film was stabilized by rubbing the resin containing the conductive substance while applying pressure by means of a buffer made of an elastic material. The resin containing the conductive substance can be formed more stably if a pattern of transparent electrodes formed on the substrate against which the resin is rubbed is continuous. Therefore, the resin containing the conductive substance was stably formed on the pattern by providing a dummy pattern at portions where the pattern does not exist.

In a method of forming electrodes on a substrate, a resin containing a conductive substance was formed on a substrate on which a pattern of a transparent conductive film was formed, only on the pattern by rubbing the resin against the entire substrate. The resin containing the conductive substance was stably formed on the pattern by attaching a fiber member to the tip of a rubbing tool. The resin containing the conductive substance was stably formed on the pattern by rubbing the resin while rendering it in a half state. That is, prior to rubbing the resin, the resin is cured half-way into an elastomer state.

In a manufacturing process, the productivity was improved by a process in which the rubbing is performed after the resin containing the conductive substance was formed on the substrate by printing or with a dispenser. Uniform film thickness was obtained by performing the rubbing by squeegeeing.

A transparent conductive film formed by sputtering and that formed by evaporation were different in surface asperity. The adhesiveness was improved by using a film formed by evaporation which film had a large degree of surface asperity. The adhesiveness of the resin containing the conductive substance was improved by giving asperity to the surface of the transparent conductive film by performing exposure by forming, in an exposure mask to be used in patterning the transparent conductive film, minute holes for a positive resist and minute points for a negative resist.

In a method of mounting a semiconductor chip on a substrate on which transparent electrodes were formed, a resin containing a conductive substance was rubbed against the substrate, and bumps of a semiconductor chip were connected to the transparent electrodes through a resin layer thus formed. A height variation of the IC chip was absorbed by the resin. Since the transparent electrodes and the resin containing the conductive substance were bonded to each other and the gold bumps of the IC and the resin containing the conductive substance were connected to each other with a stronger bonding force than in the above connection, a stable connection resistance was obtained. The reliability was further improved by reinforcing the connecting portions of the terminal portions of the semiconductor chip and the transparent electrodes by an adhesive whose thermal expansion coefficient was equal to or smaller than that of the resin containing the conductive substance that had been.

In a method of mounting a film substrate on a substrate on which transparent electrodes were formed, terminals of the film substrate were connected to terminals of a transparent conductive film on which a resin containing a conductive substance had been formed by rubbing it against the substrate. Use of a UV-curing type adhesive made it possible to perform normal temperature connection, and to use an inexpensive polyester substrate because substrate expansion did not occur that would have occurred in the case of thermo-compression bonding.

With the above constitution, the auxiliary electrodes were formed on the transparent electrodes inexpensively, and the resistance of the transparent electrodes was reduced to less than 50%.

In the COG mounting, it has become possible to connect the bumps of an IC chip to the terminals of a transparent conductive film through the resin stuck to the latter. The connection was made with the bump height of the IC chip that was as small as 30 µm. The reliability was improved by inserting the resin between the IC chip and the substrate.

By virtue of low connection temperature, it has become possible to perform connection even if film substrates such as a TCP and FPC and other substrates are not high in heat resistance.

BRIEF DESCRIPTION OF THE DRAWINGS

FIG. 4 illustrates Embodiment 3, i.e., shows a process in which rubbing a resin containing silver particles is performed with a fiber cap attached to the tip of a pressure rubbing shaft.

DETAILED DESCRIPTION OF THE PREFERRED EMBODIMENTS

The present invention will be hereinafter described in detail by way of embodiments.

(Embodiment 1)

Figure 1:
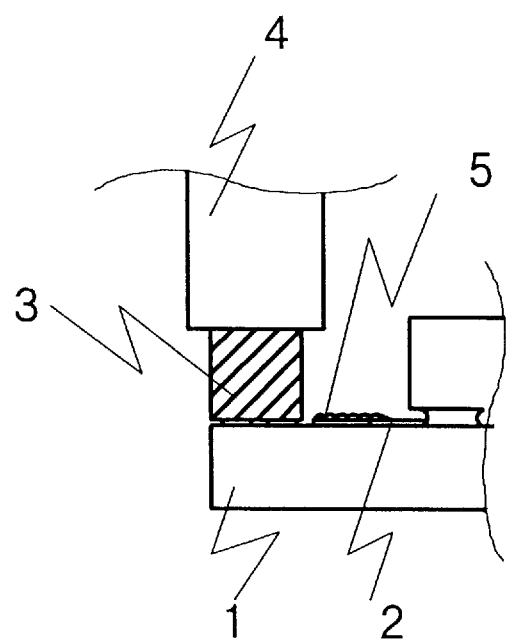
FIG. 1 illustrates Embodiment 1, i.e., shows a process of rubbing a resin that contains silver particles against a transparent electrode on a substrate.
Figure 2:
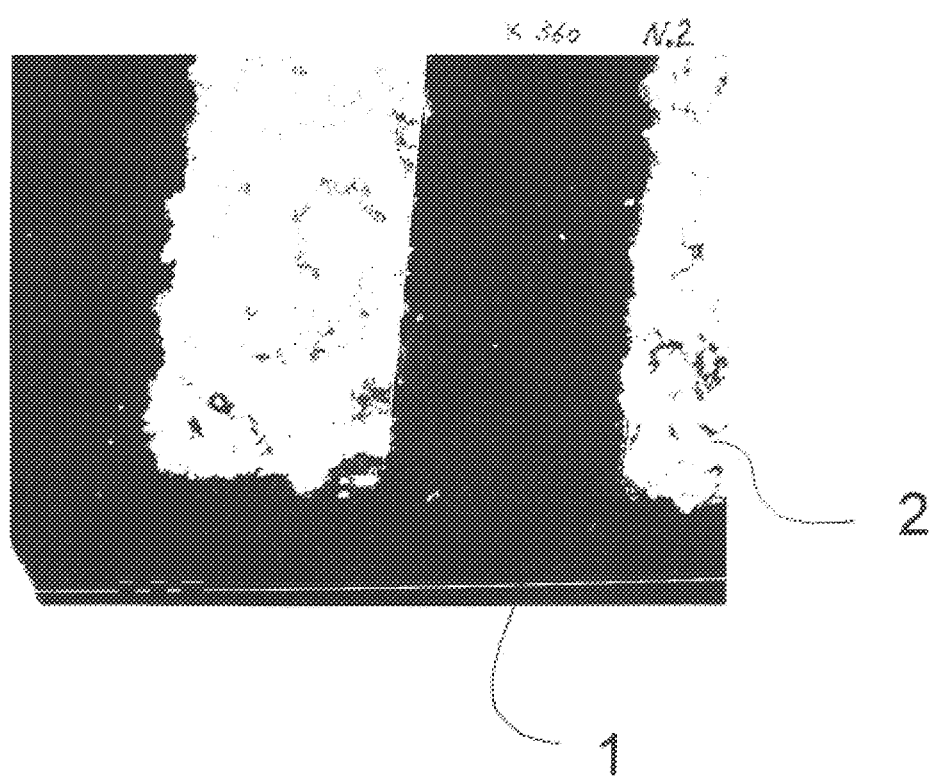
FIG. 2 is an electron microscope picture (substitute for a drawing) showing a result of rubbing a resin that contains silver particles against a transparent electrode on a glass substrate.

FIG. 1 illustrates Embodiment 1. A 0.15-µm-thick pattern 2 made of ITO is formed on a glass substrate 1. Reference numeral 3 denotes a block comprised of a resin containing a conductive substance, which is silver particles of 2 µm in size and contained in the resin by about 90 wt%. Polyurethane, acrylic, epoxy, polyester, etc. are used as the resin. Polyurethane is preferable when the material is heated and then blocked. A resin layer 5 mixed with silver particles is transferred only to the ITO surface and not transferred to the glass surface by rubbing with the block 3, that is produced by heating a mixture of a polyurethane resin and silver particles against the substrate over the whole area with a pressing member such as a pressure of 3–5 kg/cm$^2$ by means of a pressure rubbing shaft 4. FIG. 2 is an electron microscope picture of a transferred Ag paste, which shows that the Ag paste is laid only on the ITO surface and is not transferred to the glass surface. Further, the Ag paste can be laid densely over the whole area by rubbing the Ag paste over again. The rubbing may be performed in various methods such as a one-axis direction method, a rotational one-axis direction method and a plane rotation method. The resistance after the transfer was 50% to 30% of that of the pattern made only of ITO. It is noted that cleaning should be performed sufficiently before the transfer because the transfer performance becomes worse if the ITO surface is contaminated with grease etc.

(Embodiment 2)

Figure 3:
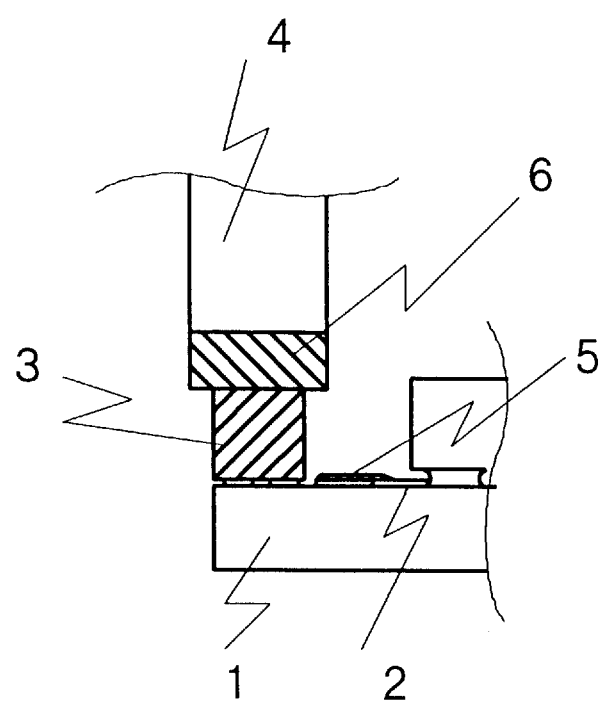
FIG. 3 illustrates Embodiment 2, i.e., shows a state in which rubbing with a block is being performed with a rubber buffer attached to the tip of a pressure rubbing shaft.

FIG. 3 illustrates Embodiment 2. In the method of Embodiment 1, there occurs a difference in the transfer film thickness due to imbalance between frictional forces. More specifically, there occurs a thickness variation of 0.5–2.5 $\mu$m between a portion of high pressure and a portion of low pressure. Stable formation has become possible by providing a rubber buffer 6 between the pressure rubbing shaft 4 and the block 3.

(Embodiment 3)

FIG. 4 illustrates Embodiment 3. In Embodiment 1, in which polyurethane was used as the resin, the reliability, more specifically, the film adhesiveness, was not sufficient. To solve this problem, a polyester resin 8 containing silver was used. Rubbing was performed such that the polyester resin containing silver was rendered in a half state (i.e., cured half-way into an elastomer state) and a fiber cap 7 was attached to the pressure rubbing shaft 4. An Ag paste layer formed on the transparent conductive film well withstood a tape peeling test etc.

(Embodiment 4)

Figure 5:
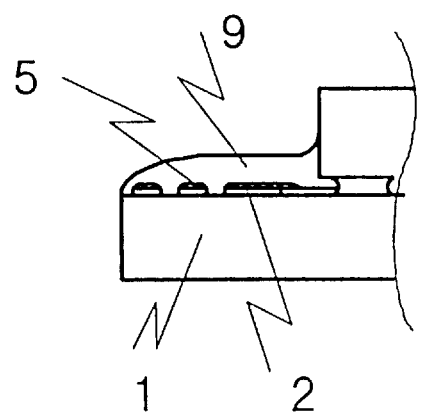
FIG. 5 is a sectional view of a structure produced by coating with a silicone resin after an auxiliary electrode is formed by the method of the invention.

The auxiliary electrode of Embodiment 1 was likely damaged by external impact. To solve this problem, after the auxiliary electrode 5 was formed in the same manner as in Embodiment 1, it was covered with a silicone resin 9. FIG. 5 shows a cross-section in this state. The reliability was improved because electrode peeling due to external impact was prevented.

(Embodiment 5)

Figure 6:
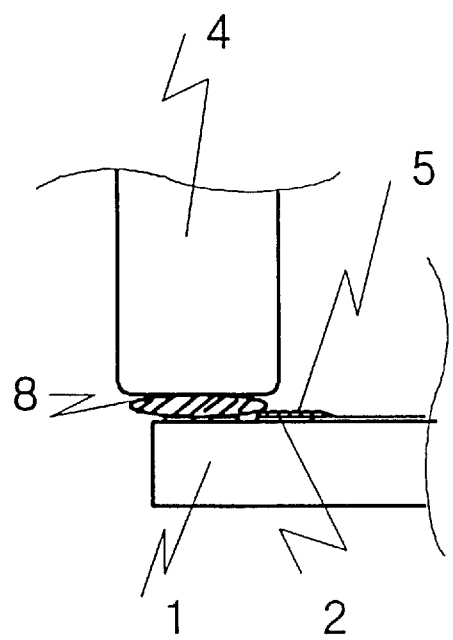
FIG. 6 illustrates a process of transferring a resin containing conductive particles.
Figure 7:
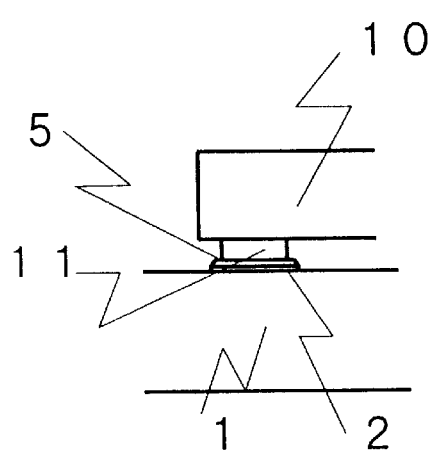
FIG. 7 is a sectional view of a structure in which an IC chip is bonded to a transparent conductive film on a substrate through the resin layer of the invention.

FIG. 6 illustrates transfer of a resin containing conductive particles to a substrate. A 0.15-$\mu$m-thick pattern 2 made of ITO is formed on a glass substrate 1 at a pitch of 200 $\mu$m so as to face terminal pads of a semiconductor device, such as an IC chip 10 shown in FIG. 7. Reference numeral 8 denotes a polyester resin containing silver particles produced by mixing silver particles of less than 2 $\mu$m in size by about 90 wt% and then rendering it in a half state by heating. The resin 8 containing silver particles was transferred only to the ITO surface by rubbing it over the whole area with a pressure of 3–5 kg/cm$^2$ by means of a pressure rubbing shaft 4. It is noted that cleaning such as degreasing should be performed sufficiently before the transfer because the transfer performance becomes worse if the ITO surface is contaminated with grease etc. FIG. 7 shows a cross-section in which the IC chip 10 is connected to the transparent electrode 2 on the substrate 1 through the resin layer 5 that has been transferred in the above manner. The IC chip 10 having gold bumps 11 of 20 $\mu$m in height arranged at pad portions was positioned with respect to the ITO terminals 2 on the glass substrate 1, and they were connected, i.e., bonded to each other by fully setting the resin containing a conductive substance by thermo-compression bonding.

(Embodiment 6)

Figure 8:
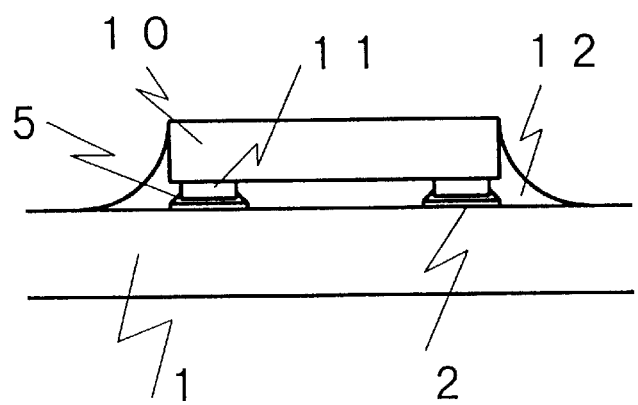
FIG. 8 is a sectional view of a structure in which an IC chip is bonded to a transparent conductive film on a substrate through the resin layer of the invention and the resulting structure is coated with a reinforcing resin.

In Embodiment 5, in which the connection by bonding is effected only by the resin layer containing silver particles, the connecting portion is weak, i.e., the reliability in terms of strength is low. To solve this problem, the following method was employed. A thermosetting reinforcing resin 12 that has approximately the same thermal expansion coefficient as the polyester resin containing silver particles was applied after the polyester resin containing silver particles was transferred to ITO electrodes. An IC chip 10 having gold bumps 11 of 20 $\mu$m in height arranged at pad portions was positioned with respect to the ITO terminals 2 on the substrate 1, and they were connected, i.e., bonded to each other by fully setting the resin containing silver particles and the thermosetting reinforcing resin 12 by further heating FIG. 8 shows a cross-section in this state. The reliability was further improved by the above process. Alternatively, a UV-curing type adhesive as the reinforcing resin was preliminarily coated on the substrate side, and was set by UV illumination after the IC chip 10 was positioned with respect to the Ag-paste-transferred terminals on the substrate. Stable connection was obtained even where this process was performed with the polyester resin containing silver particles kept half-set.

(Embodiment 7)

Figure 9:
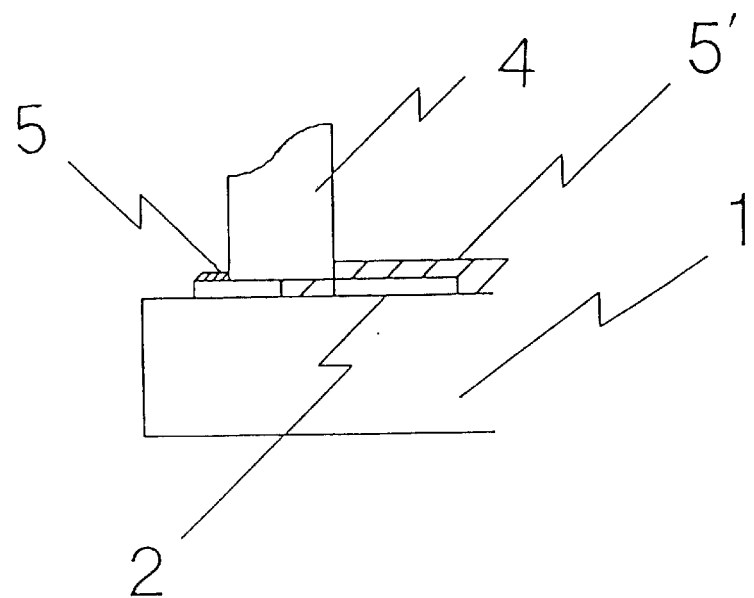
FIG. 9 illustrates a state in which a resin layer containing Ag particles that has been applied by screen printing is being rubbed by means of a pressure rubbing shaft.

Depending on the method of supplying the silver paste, its surface may be in a tack free state, in which case the surface portion does not adhere to the transparent conductive film. To solve this problem, rubbing by means of the pressure rubbing shaft 4 is effected after a polyester Ag paste is applied in advance by screen printing and rendered in a half-set state. FIG. 9 illustrates this state. The resin layer 5' containing conductive particles that has been applied by screen printing also develops in the areas of the glass substrate other than the transparent conductive films, and is thick. However, the Ag paste coated on the glass substrate 1 was removed by rubbing, and a thin resin layer 5 containing silver was formed only on the transparent conductive films. It was confirmed that the resin 5' containing silver can be supplied by various methods other than screen printing, such as relief printing and a method using a dispenser.

(Embodiment 8)

Figure 10:
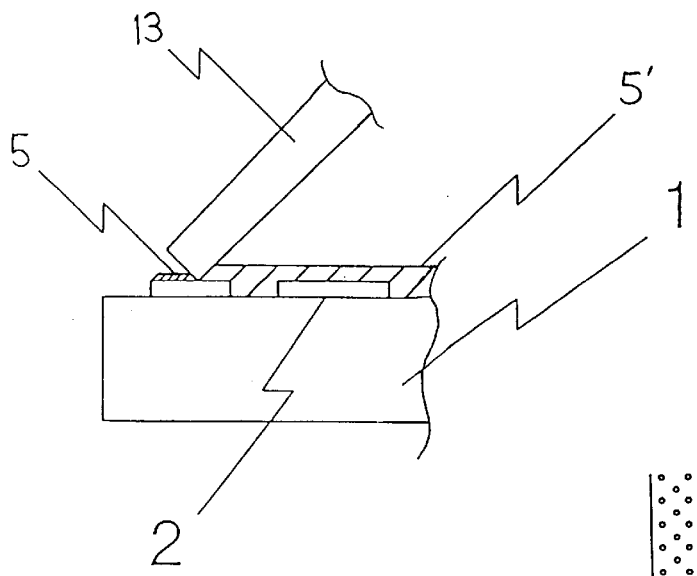
FIG. 10 illustrates a state in which a coated resin layer containing conductive particles is being rubbed by squeegeeing.

FIG. 10 illustrates rubbing by squeegeeing. It was difficult to perform control in the rubbing method of Embodiment 7 because of the plane rotation method requires control in which speed and force conditions are intermixed in a complicated manner. To solve this problem, rubbing was performed by squeegeeing by use of a rubbing plate 13. As a result, it has become possible to coat the resin 5 containing a conductive substance on the ITO pattern 2 with stable rubbing conditions.

(Embodiment 9)

Figure 11:
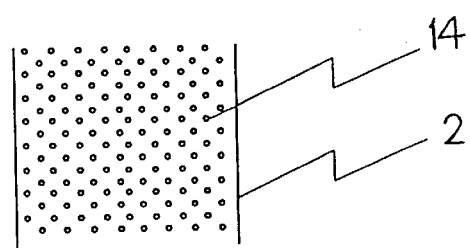
FIG. 11 is a top view of a transparent conductive film that is so patterned as to have minute holes.

Although the transparent electrode can be formed by various methods such as sputtering, evaporation and ion plating, a transparent electrode formed by evaporation well adheres to a resin containing conductive particles that is applied by rubbing. This is due to the surface asperity. A sputtering film, which is relatively low in the degree of asperity, cannot provide sufficient adhesiveness. To solve this problem, minute holes 14 were formed as shown in FIG. 11 when a sputtering film as the transparent conductive film was patterned. This improved adhesiveness of conductive particles.

(Embodiment 10)

Figure 12:
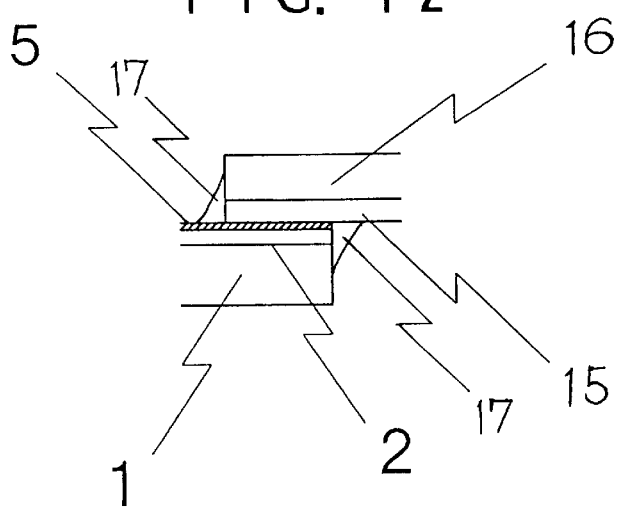
FIG. 12 is a sectional view of a structure in which transparent electrodes on a substrate and FPC terminals are connected to each other through a resin layer containing conductive particles.
Figure 13:
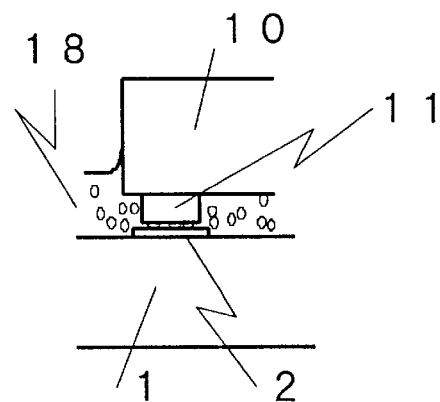
FIG. 13 is a sectional view showing a conventional technique in which transparent electrodes on a substrate are connected to an IC chip with an anisotropic conductive adhesive.

FIG. 12 shows a cross-section of a structure in which transparent conductive films and FPC terminals are connected to each other by a method of the invention. An Ag paste was formed on an ITO pattern 2 that is formed on a glass substrate 1, in the same manner as in Embodiment 1. FPC terminals 15 produced by patterning a metal film evaporated on a polyester film 16 were connected to the transparent films through the resin containing a conductive substance. Connection was made with a low connection resistance.

Further, the reliability was improved by connecting and holding the glass substrate and the ITO pattern by a UV-curing type resin 17.

As described above, the ITO auxiliary electrodes were formed less expensively even than by an electroless plating method. It was confirmed that the conductor width as short as 10 μm could be obtained; that is, it has become possible to lay out a high-density pattern more easily than in a printing method of a conductive paste. In addition to using a resin, there is a possibility that transfer can be performed by using only metal, in which case it is expected that the auxiliary electrode can be formed inexpensively. This can solve, in an inexpensive manner, a problem of a voltage drop due to a transparent electrode in such mounting methods as COG.

Further, the invention provides an effective connecting agent for a FPC and TCP, and for connection between an IC and transparent electrodes in COG mounting. Instead of Ag particles conductive particles that are used in an anisotropic film can be used. Further, since low-temperature processing can be performed by using a UV-curing type adhesive, it has become possible to use, for a FPC substrate, materials such as a polyester resin that are less expensive than polyimide films. Further, by being free of expansion of a terminal portion of a FPC or TCP that occurs in a connecting process using an anisotropic conductive film, the invention can provide an accurate and stable connection.

What is claimed is:

1. A method of coating a conductive substance on a transparent electrode disposed on a surface of a substrate, comprising the steps: disposing a resin containing a conductive substance over the surface of a substrate having thereon a transparent electrode; and rubbing and pressing the resin over the surface of the substrate with a pressing shaft to coat the resin on the transparent electrode.

2. A method according to claim 1; including the step of curing the resin into an elastomeric state before the rubbing and pressing step.

3. A method according to claim 1; wherein the resin comprises a polyester resin containing the conductive substance; and wherein the rubbing and pressing step comprises rubbing and pressing the polyester resin with a fiber element integrally connected to an end of the pressing shaft.

4. A method according to claim 1, wherein the pressing shaft has an elastic portion; and wherein the rubbing and pressing step comprises rubbing and pressing the resin with the elastic portion of the pressing shaft.

5. A method according to claim 1; including the step of curing the resin before the rubbing and pressing step.

6. A method of mounting a semiconductor chip on a substrate having a transparent electrode disposed on a surface thereof, comprising the steps: supplying a resin containing a conductive substance over the surface of a substrate having thereon a transparent electrode; pressing the resin to form a resin layer; and connecting a terminal portion of a semiconductor chip to a transparent electrode through the resin layer.

7. A method according to claim 6; wherein the terminal portion of the semiconductor chip has a bump portion.

8. A method according to claim 6; wherein the pressing step comprises pressing the resin layer with a pressing shaft.

9. A method according to claim 8; wherein the resin comprises a polyester resin containing the conductive substance; and wherein the pressing step comprises pressing the polyester resin with a fiber element integrally connected to an end of the pressing shaft.

10. A method according to claim 8; wherein the pressing shaft has an elastic portion; and wherein the pressing step comprises pressing the resin with the elastic portion of the pressing shaft.

11. A method according to claim 6; wherein the pressing step comprises applying pressure to the resin while rubbing the resin over the surface of the substrate to form the resin layer on the transparent electrode.

12. A method according to claim 6; wherein the connecting step comprises setting the resin layer to bond the terminal portion of the semiconductor chip to the transparent electrode.

13. A method according to claim 12; wherein the resin layer is set by thermo-compression bonding.

14. A method according to claim 12; including the step of applying an adhesive to reinforce the connection between the terminal portion of the semiconductor chip and the transparent electrode, the adhesive having a thermal expansion coefficient equal to or smaller than a thermal expansion coefficient of the resin layer which has been set.

15. A method of mounting a film substrate on a substrate having a transparent electrode disposed on a surface thereof, comprising the steps: supplying a resin containing a conductive substance over the surface of a substrate having thereon a transparent electrode; rubbing the resin to form a resin layer; and connecting a terminal portion of a film substrate to a transparent electrode through the resin layer.

16. A method according to claim 15; wherein the rubbing step comprises rubbing the resin layer with a shaft.

17. A method according to claim 16; wherein the resin comprises a polyester resin containing the conductive substance; and wherein the rubbing step comprises rubbing the polyester resin with a fiber element integrally connected to an end of the shaft.

18. A method according to claim 16; wherein the shaft has an elastic portion; and wherein the rubbing step comprises rubbing the resin with the elastic portion of the shaft.

19. A method according to claim 15; further including the step of applying an adhesive to reinforce the connection between the terminal portion of the film substrate and the transparent electrode.

20. A method of coating a conductive substance, comprising the steps: providing a substrate having a transparent conductive film disposed on a surface thereof; disposing a resin containing the conductive substance over the substrate; and coating the conductive substance on the transparent conductive film by pressing the resin with a pressing member while moving the pressing member over the surface of the substrate.

21. A method of coating a conductive substance according to claim 20; wherein the pressing member has an elastic portion; and wherein the coating step comprises pressing the resin with the elastic portion of the pressing member.

22. A method of coating a conductive substance according to claim 20; wherein the resin comprises a polyester resin containing the conductive substance; and wherein the coating step comprises pressing the polyester resin with a fiber element integrally connected to an end of the pressing member.

23. A method according to claim 20; including the step of curing the resin before the coating step.

24. A method according to claim 20; including the step of curing the resin into an elastomeric state before the coating step.

25. A method of mounting a semiconductor device having terminal portions on a transparent substrate having transparent electrodes on a surface thereof, comprising the steps: supplying a resin containing a conductive substance over the surface of a transparent substrate having transparent electrodes thereon; pressing the resin using a pressing member while moving the pressing member over the surface of the transparent substrate to form a resin layer on each of the transparent electrodes; and connecting terminal portions of a semiconductor device to respective ones of the transparent electrodes through the resin layer.

26. A method according to claim 25; wherein the resin comprises a polyester resin containing the conductive substance; and wherein the pressing step comprises pressing the polyester resin with a fiber element integrally connected to an end of the pressing member.

27. A method according to claim 25; wherein the pressing member has an elastic portion; and wherein the pressing step comprises pressing the resin with the elastic portion of the pressing member.

28. A method according to claim 25; wherein the connecting step comprises setting the resin layers to bond respective terminal portions of the semiconductor device to the transparent electrodes.

29. A method according to claim 28; wherein the resin layers are set by thermo-compression bonding.

30. A method according to claim 25; including the step of applying an adhesive to reinforce the connection between the terminal portions of the semiconductor device and the transparent electrodes, the adhesive having a thermal expansion coefficient equal to or smaller than a thermal expansion coefficient of each of the resin layers which have been set.

* * * * *